(12) United States Patent
Huynh

(10) Patent No.: US 6,891,425 B1
(45) Date of Patent: May 10, 2005

(54) LOW VOLTAGE OR'ING CIRCUITS AND METHODS WITH ZERO RECOVERY TIME

(75) Inventor: Thong Anthony Huynh, Fremont, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 45 days.

(21) Appl. No.: 10/434,956

(22) Filed: May 9, 2003

(51) Int. Cl.$^7$ .............................................. H03K 17/687
(52) U.S. Cl. ...................................... 327/427; 327/313
(58) Field of Search ................................ 327/427, 313, 327/328, 423; 361/84; 307/127

(56) References Cited

U.S. PATENT DOCUMENTS 5,636,116 A * 6/1997 Milavec et al. ................ 363/89
5,726,505 A * 3/1998 Yamada et al. ............. 307/127

FOREIGN PATENT DOCUMENTS

JP 2002152978 A * 5/2002 ............. H02J/7/00

OTHER PUBLICATIONS

Fairchild Semiconductor Corporation KA5M0965Q Fairchild Power Switch (FPS) Data Sheet, 2001, pp. 1–12.

* cited by examiner

Primary Examiner—Quan Tra
(74) Attorney, Agent, or Firm—Blakely Sokoloff Taylor & Zafman LLP

(57) ABSTRACT

Low voltage drop ORing circuits with zero recovery time and reverse current protection. In use, a MOSFET is coupled between a power supply and a load in a multiple power supply, single load system, or between a power supply and a load in a single power supply, multiple load system, or in both locations in multiple power supply, multiple load systems. A controller senses the current through the MOSFET, and turns the MOSFET off when the current falls below a predetermined threshold current. This allows time for circuit delays and the discharge of the gate of the MOSFET to turn the MOSFET off before the current through the MOSFET car reverse. Turn-on of the MOSFET when the current exceeds the threshold may be purposely slowed to avoid current spikes. Addition of another MOSFET controlled by the controller adds a hot swap capability and the control of the $V_C$ slew rate. Various other features and embodiments are disclosed, including various current sensing techniques and circuits using transistors other than MOSFETs.

39 Claims, 10 Drawing Sheets

FIG. 7
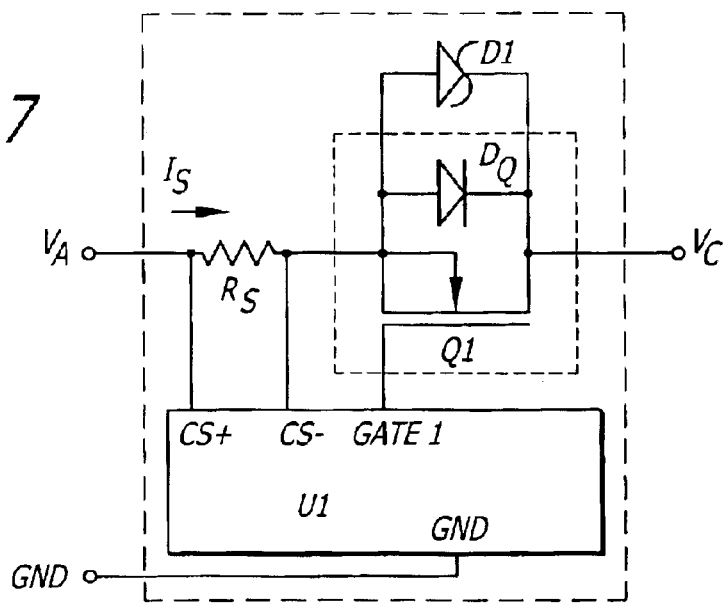
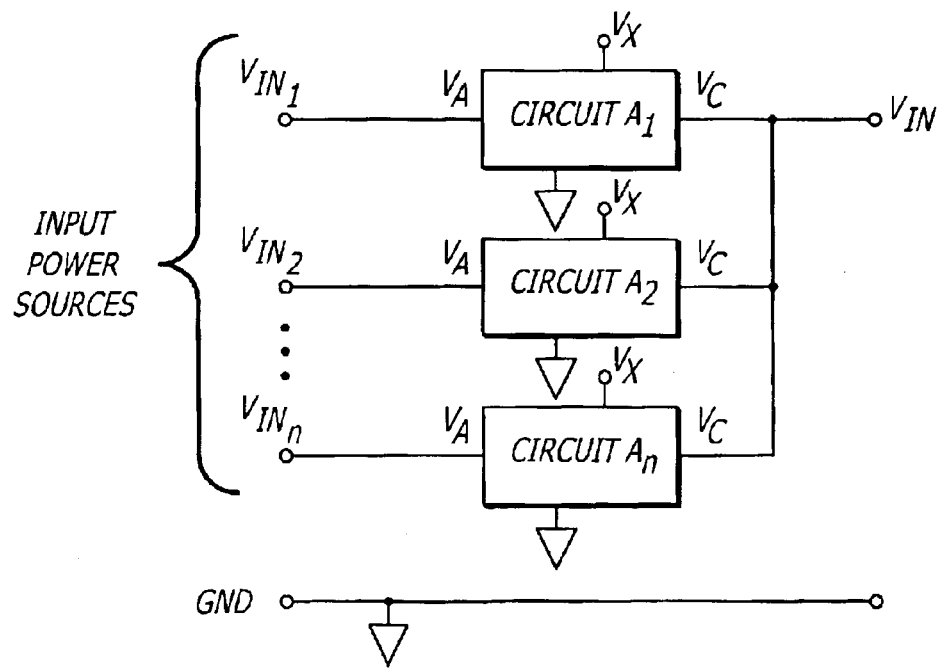
FIG. 8

US 6,891,425 B1

LOW VOLTAGE OR'ING CIRCUITS AND METHODS WITH ZERO RECOVERY TIME

BACKGROUND OF THE INVENTION

1. Field of the Invention

The present invention relates to the field of power supply circuits.

2. Prior Art

In certain electronic equipment, it is desired or necessary to have two or more power supplies coupled to the equipment so that upon failure of one power supply to provide power to the equipment, another supply will automatically take over. The multiple power supplies may be of the same type or may be of different types. By way of example, redundant electronic supplies may be provided so that a failure of any one supply will not effect the operation of the equipment powered from the redundant supplies. In other cases, one supply might be an electronic supply powered from a municipal power supply, with a second supply being a battery backup supply. Thus, failure of the electronic supply or loss of municipal power will result in a takeover by the battery backup system.

In a redundant supply system, the multiple supplies may be of the same or of different voltages. If the voltages are different, typically the power is supplied to the load by the higher voltage active supply.

In such redundant power systems, it is usually desired to connect the redundant power supplies in parallel in a manner whereby the lower voltage power supplies cannot draw current from the higher voltage power supplies. For this purpose, some circuit must be connected between each of the multiple power supplies and the common load connection to potentially supply current to the load from any of the power supplies without any power supply drawing current from any other power supply. For this purpose, a simple diode connection between each power supply and the load has been used in the prior art. By way of example, FIG. 1a shows diodes D1 through Dn for coupling n power supplies, supplying voltages VIN1 through VINn to the input of the load Vin. Such diodes, passing current in one direction but not in the other, provide the desired function of supplying current to the input terminal VIN of the load while blocking all current flow between power supplies. Such circuits are referred to as input ORing circuits, as the load is powered by the first power supply or the second power supply or the third power supply, etc., whichever has the higher output voltage.

While FIG. 1a presents a prior art circuit for use on the positive side of the power supplies, FIG. 2a presents a corresponding circuit for use on negative power supplies or the negative side of power supplies. In addition, in some situations, it is desired to use a single power supply to power multiple loads, or at least potentially power multiple loads simultaneously without any one load being able to provide current back to any other load. FIG. 1b shows a diode circuit for such purpose for use on the positive power supply side, whereas FIG. 2b shows a corresponding circuit for use on the negative side of the power supply. Such circuits are referred to as output ORing circuits and might be used, by way of example, on battery chargers wherein a single charger is coupled to multiple rechargeable batteries. This allows multiple batteries to be charged by a single charger without any battery being discharged when the charger is off and a load on another battery discharges that other battery.

The use of diodes in this manner is simple, inexpensive and reliable. However, silicon diodes have a forward conduction voltage drop on the order of 0.7 volts. In the case of 12 volt lead acid batteries, such a diode voltage drop would result in approximately 5% of the power passing through the diode being dissipated in the respective diode. This may be tolerable in many applications. However, many present electronic systems operate at much lower voltages, such as 5 volts, 3.3 volts and even lower. At these voltages, a 0.7 volt drop represents a much higher percentage of power dissipation, thereby increasing the size of the power supplies needed, the cooling needed for the system, and making the equipment more expensive to operate. Also, while the use of Schottky diodes can somewhat reduce the power dissipation in the diodes, the reduction in the power dissipation is only partial.

Accordingly, in the prior art power MOSFETs have been used in place of the diodes. For instance, FIGS. 3a and 3b show n-channel MOSFET positive side power supply input ORing and output ORing circuits corresponding to FIGS. 1a and 1b, respectively, and FIGS. 4a and 4b show corresponding positive side input ORing and output ORing circuits using p-channel MOSFET devices. FIGS. 5a and 5b show n-channel MOS negative side input ORing and output ORing power supply circuits corresponding to those of FIGS. 2a and 2b, respectively, and FIGS. 6a and 6b show p-channel MOS negative side input ORing and output ORing power supply circuits corresponding to those of FIGS. 2a and 2b. In the prior art, the MOSFET devices are switched either by monitoring the input voltage, or both the input and output voltage.

BRIEF DESCRIPTION OF THE DRAWINGS

FIG. 7 presents a first embodiment of the present invention ORing circuit using an n-channel MOSFET device.

FIG. 8 illustrates the use of the embodiment of FIG. 7 in a redundant power supply application.

FIG. 21 presents an embodiment similar to that of FIG. 10, but sensing current by sensing the voltage drop across transistor Q1 (or M1) when the transistor is on.

DETAILED DESCRIPTION OF THE PREFERRED EMBODIMENTS

Now referring to FIG. 7, one embodiment of the present invention may be seen. This embodiment uses an n-channel MOSFET switch Q1 with inherent body diode $D_{Q1}$. A sense resistor $R_S$ is in series with the MOSFET Q1, in the embodiment shown between the input power $V_A$ and the drain of the MOSFET, through the sense resistor $R_S$ could be located between the source of MOSFET Q1 and the output $V_C$. Coupled to the sense resistor $R_S$ is a control circuit U1 for sensing the voltage across the sense resistor $R_S$ (pins CS+ and CS−) to control the gate of the MOSFET Q1 by way of an output voltage provided by the controller U1 on the terminal Gate 1. In a typical application, the controller U1 will be provided in integrated circuit form, with the sense resistor $R_S$ and the MOSFET Q1 provided in discreet form, as the MOSFET Q1 typically will be a power MOSFET with the sense resistor $R_S$ being quite a low valued resistor (0.005 ohms in one embodiment). In alternate embodiments, either the sense resistor $R_S$ or the MOSFET Q1, or both, may be made part of the integrated circuit if the required power levels to be delivered are amenable to such integration.

The operation of the circuit of FIG. 7 may be described with respect to its use in a system having redundant power supplies as shown in FIG. 8. Each of the circuits A1 through An in such a system may be in accordance with circuit A of FIG. 7. Assume for the moment that the voltage VIN1 in FIG. 8 is higher than the remaining voltages for circuits A2 through An. (For clarity, terminals and the respective voltages on the terminals are given the same reference herein. By way of example, VIN1 may be referred to as the respective terminal in some places and as the voltage on that terminal in other places.)

Referring to FIG. 7, assume for the moment that power is applied to terminal $V_A$, and a load is connected to $V_C$, the only active source of power connected to the load. The full load current for the load connected to Vin (FIG. 8) will be provided through the sense resistor $R_S$ and initially through the body diode $D_{Q1}$ of MOSFET transistor Q1. The integrated circuit controller U1 will sense the voltage between the terminals CS+ and CS− due to the load current to drive the gate of n-channel MOSFET Q1 high to turn on the MOSFET and hold it on. Since the on resistance of a power MOSFET is quite low and the value of the sense resistor $R_S$ is also quite low, the voltage drop from $V_A$ to $V_C$ will be quite low, such as on the order of low tens of millivolts.

Figure 1A:
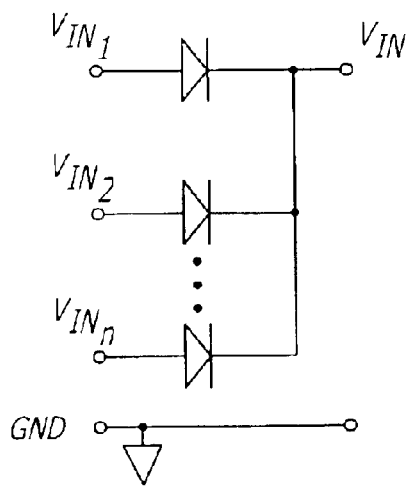
FIG. 1a shows diodes D1 through Dn for coupling n power supplies, supplying voltages VIN1 through VINn, to the input of a load Vin.
Figure 1B:
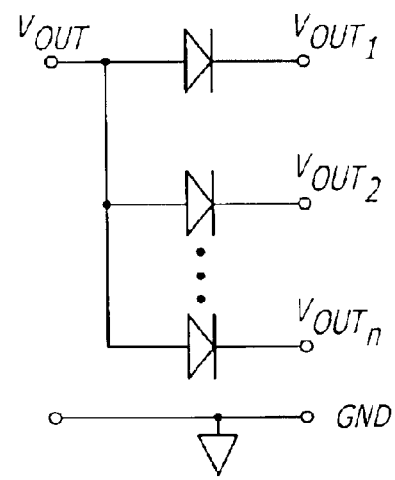
FIG. 1b shows diodes D1 through Dn for coupling one power supply to multiple loads.
Figure 2A:
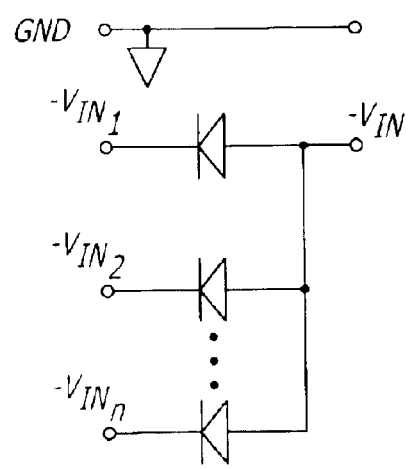
FIGS. 2a and 2b show circuits similar to those of FIGS. 1a and 1b, respectively, for negative power supplies.
Figure 2B:
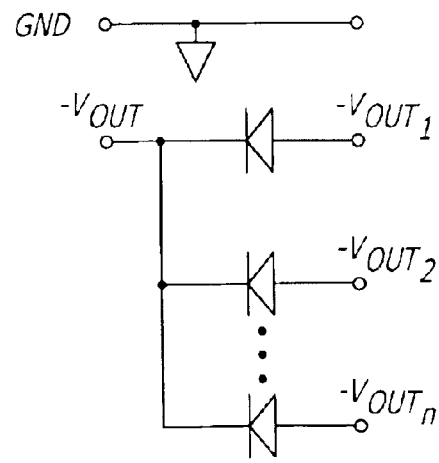
Figure 3A:
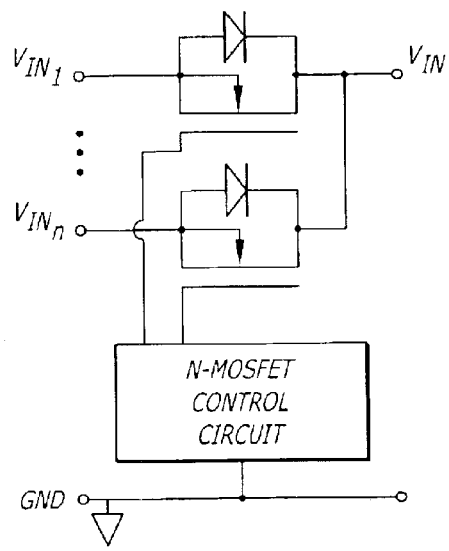
FIGS. 3a and 3b show n-channel MOSFET positive side power supply circuits corresponding to FIGS. 1a and 1b, respectively.
Figure 3B:
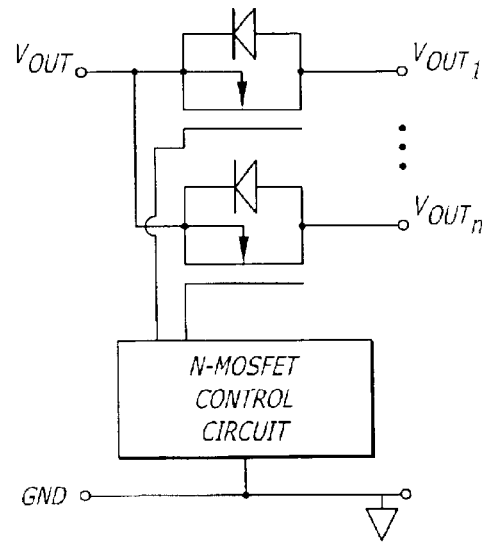
Figure 4A:
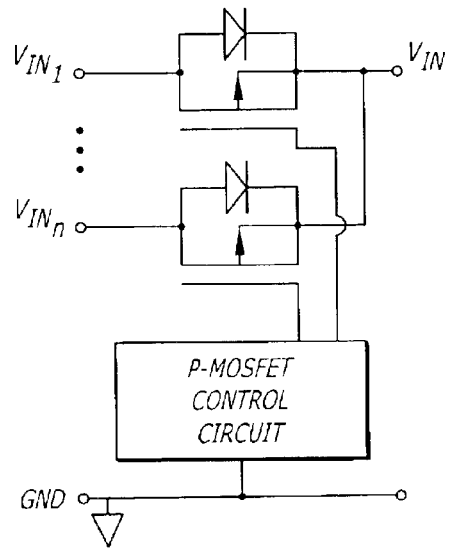
FIGS. 4a and 4b show p-channel MOSFET positive side power supply circuits corresponding to FIGS. 1a and 1b.
Figure 4B:
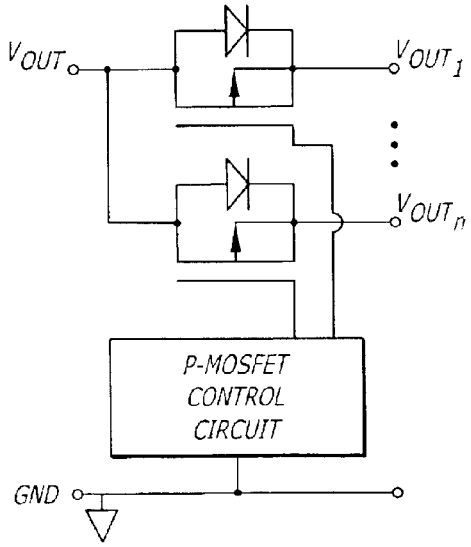
Figure 5A:
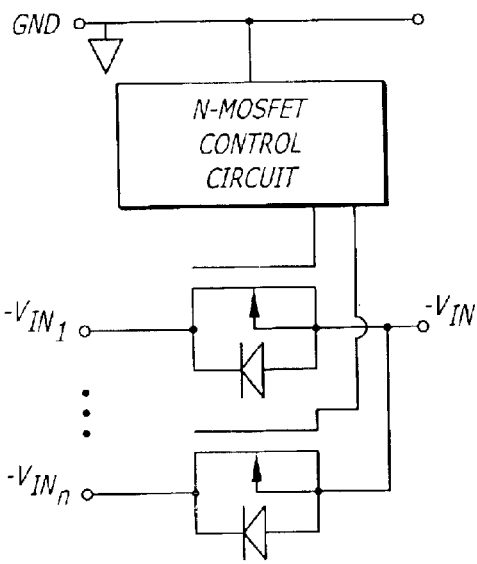
FIGS. 5a and 5b show n-channel MOSFET negative side power supply circuits corresponding to those of FIGS. 2a and 2b, respectively.
Figure 5B:
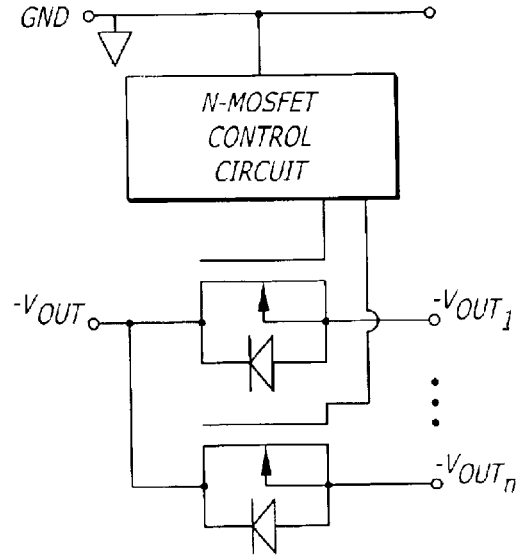
Figure 6A:
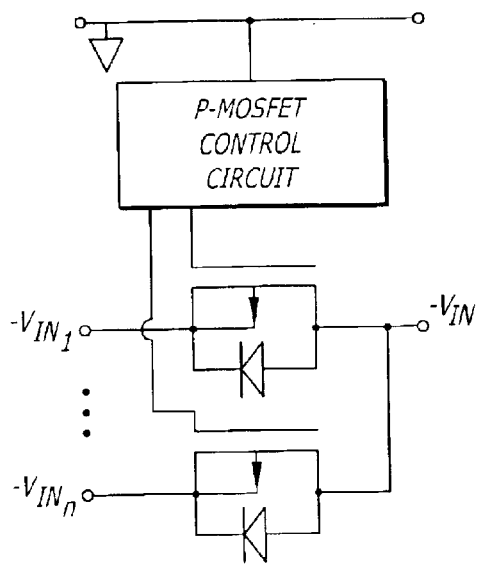
FIGS. 6a and 6b show p-channel MOSFET negative side power supply circuits corresponding to those of FIGS. 2a and 2b, respectively.
Figure 6B:
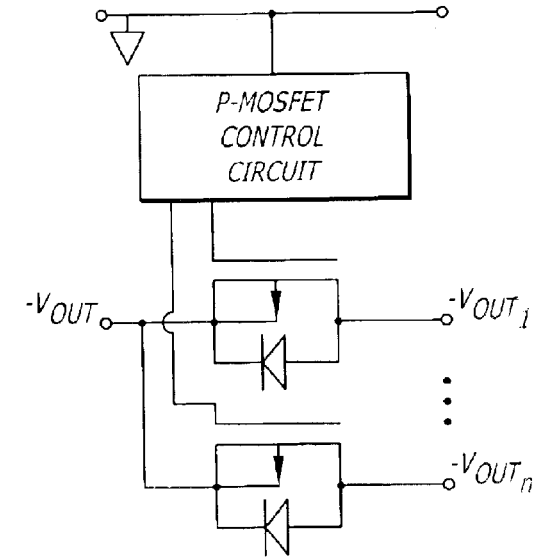
Figure 9:
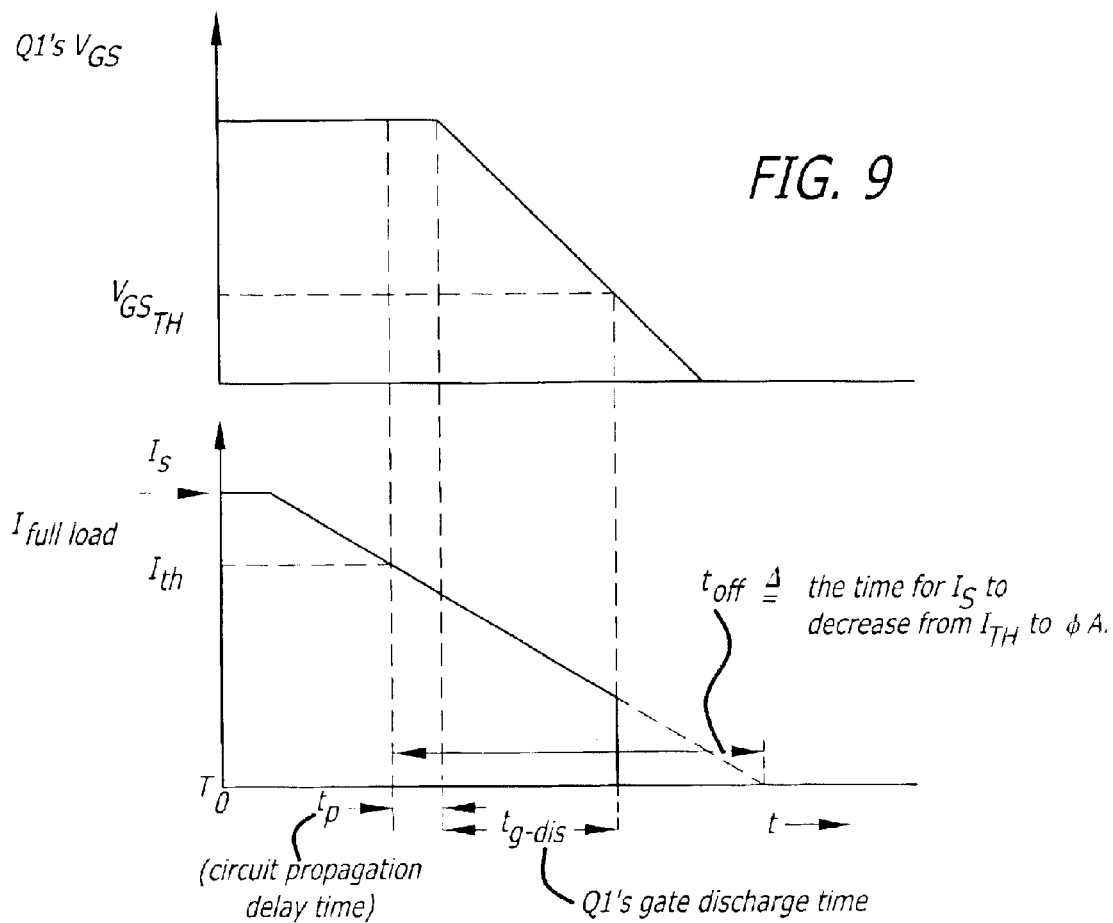
FIG. 9 presents graphs illustrating operation of the present invention.

The steady state operation is shown graphically at time T0 in the curves of FIG. 9. As is shown therein, the gate voltage $V_{GS}$ on the gate of MOSFET Q2 is held high by the integrated circuit U1 of FIG. 7, with the full load current $I_S$ passing through the sense resistor $R_S$ and MOSFET Q1. As shown in FIG. 9, the full load current is above a threshold current level $I_{TH}$, as indicated by a voltage drop across the sense resistor $R_S$ exceeding that of a threshold current set within the integrated circuit U1.

Now assume one of the other power supplies (see FIG. 8) is activated, and that the voltage VINn of that power supply has a steady state voltage $V_C$ somewhat exceeding the voltage $V_C$ of the circuit A1. The current $I_S$ through the sense resistor $R_S$ and transistor Q2 for circuit A1 will begin to decrease as the other supply begins to carry the load. When the current through MOSFET Q1 of circuit A1 reaches the threshold level $I_{TH}$ (FIG. 9), the corresponding reduction in voltage drop across the sense resistor $R_S$ will trigger the controller U1, which after a small circuit propagation delay time $T_P$, will begin decreasing the voltage and decreasing the charge of the gate of transistor Q1 of circuit A1 to turn the transistor off. As shown in FIG. 9, this allows the gate voltage $V_{GS}$ on the MOSFET Q1 of circuit A1 to decrease below the MOSFET threshold voltage $V_{GSTH}$, turning the MOSFET off $T_{GDIS}$ before the current therethrough would otherwise have decayed or gone to zero and potentially have reversed if turn-off had not been initiated until $V_C$ exceeded $V_A$ for circuit A1.

Now assume that the voltage VIN (FIG. 8) starts decreasing because of turn-off, failure or disconnection of the remaining circuits. Now the voltage $V_C$ (FIGS. 7 and 8) of circuit A1 will begin decreasing, causing the body diode $D_{Q1}$ of MOSFET Q1 to start conducting. When the current through the body diode, and thus through the sense resistor $R_S$, causes a voltage drop across the sense resistor $R_S$ corresponding to the turn-on threshold current $I_{TH}$, controller U1 will increase the voltage of the gate of MOSFET Q1 of circuit A1, turning on the MOSFET so that the circuit A1 will again carry the entire load current. Thus, reverse currents have been avoided, as with the prior art diode circuits, but with a forward voltage conduction drop on the order of low tens of millivolts, as opposed to high hundreds of millivolts characteristic of the prior art diode circuits. The turn-on of MOSFET Q1 may be intentionally made somewhat gradual to avoid undesired current transients by a rapid turn-on of the MOSFET, as the system will be maintained by conduction through the body diode until all conduction is shifted to the MOSFET. Turn-on times might range, by way of example, from tens of milliseconds to 1 second, depending on the application, though shorter or longer times may be provided.

In setting the threshold, it is preferred to provide some hysteresis between the MOSFET Q1 turn-on threshold and turn-off threshold to avoid noise causing any indecisiveness in turning Q1 on or off. Also, for loads that may vary from time to time, one might chose relatively low current thresholds to keep MOSFET Q1 on throughout the load variation. However, alternatively, one may chose higher thresholds to allow MOSFET Q1 to turn off at lower load currents, as lower load currents would be conducted by the MOSFET body diode, and the low load current through the diode will not dissipate too much power. This will provide a longer time window to turn off MOSFET Q1 when the MOSFET must be turned off to avoid reverse currents.

It may be desired to use a circuit of the present invention in hot swap applications, such as where the circuit, with a load connected thereto, may be plugged into a motherboard or otherwise connected to an already powered system. In this case, the voltage $V_C$ (FIG. 7) would initially be zero, with the voltage $V_A$ suddenly jumping to the power supply level. Even with a purposely slow turn-on of transistor Q1, the body diode will be forward biased, as will the optional Schottky diode D1, rapidly driving the voltage $V_C$ to the voltage $V_A$ minus one forward diode voltage drop, causing a high current transient in the system. Thus, it is advantageous in some embodiments of the present invention to add a hot swap capability wherein on first powering a circuit (such as the circuits A1 through An of FIG. 8), the rate of rise of the voltage $V_C$ will be limited even if the corresponding $V_A$ (FIG. 7) substantially instantaneously jumps to its full steady-state on voltage.

Figure 10:
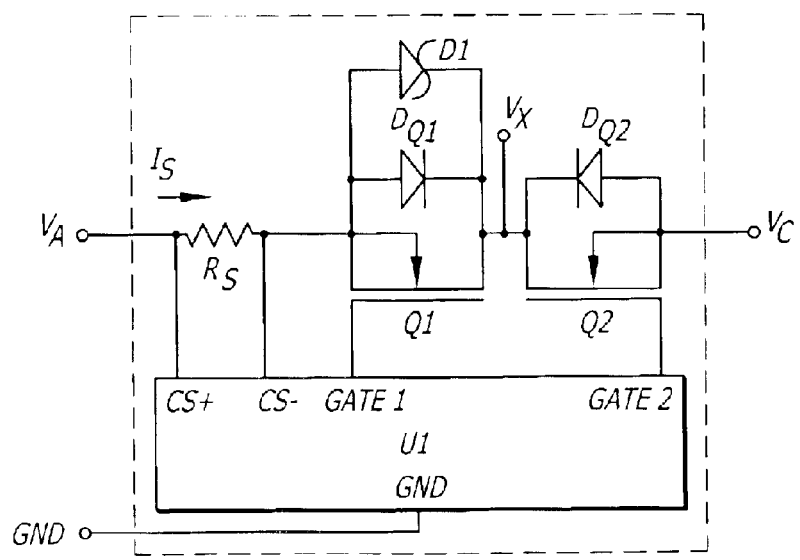
FIG. 10 presents an embodiment of the present invention further having a hot swap capability using n-channel MOSFETs.

Such an embodiment may be seen in FIG. 10. Here, an additional power n-channel MOSFET Q2 is added in series with n-channel MOSFET Q1 and the sense resistor $R_S$. Now when the voltage $V_A$ suddenly jumps to an operating voltage, integrated circuit U1 will slowly raise the voltage of the gate of MOSFET Q2. The output voltage on the terminal $V_C$ will rise at approximately the same rate as the voltage on the gate of MOSFET Q2, which rate of rise may be set in the controller U1 to limit the in-rush current to the load connected to the $V_C$ terminal. Turn-on times might range, by way of example, from tens of milliseconds to 1 second, depending on the application, though shorter or longer times may be provided.

Once MOSFET Q2 is fully turned on, the integrated circuit will hold MOSFET Q2 fully on so long as the voltage is applied to terminal $V_A$, whether or not the respective circuit is delivering current to the output terminal $V_C$. Accordingly, MOSFET Q2 provides the hot swap function on first application of power to that circuit, particularly in two instances. One, when the circuit being powered is the first circuit to deliver power to the load (initial start-up of the load). Two, when the circuit is first powered by a voltage more than one diode drop (body or Schottky) above the voltage of other circuits powering the load, so as to provide some incremental increase in the voltage on the load by conduction through the body diode. Otherwise, the slow increase in the gate voltage on MOSFET Q2 by controller U1 will generally have no effect on the system. The presence of transistor Q2 together with the current sensing however, allows incorporation of other features, if desired, such as current limiting. Current limiting may be used to determine the turn-on rate of transistor Q2 on startup, rather than using a fixed rate, and/or may be used for fault isolation. For instance, in the case of a short or other extraordinary load causing excessive current to be sensed, transistor Q2 may be turned off, initiating a restart cycle periodically to automatically restart the circuit when the fault is cleared or corrected. Alternatively, transistor Q2 may be turned partially off to continue to conduct a safe current level, automatically restarting when the current level changes to indicate a fault clearing or correction.

Figure 11:
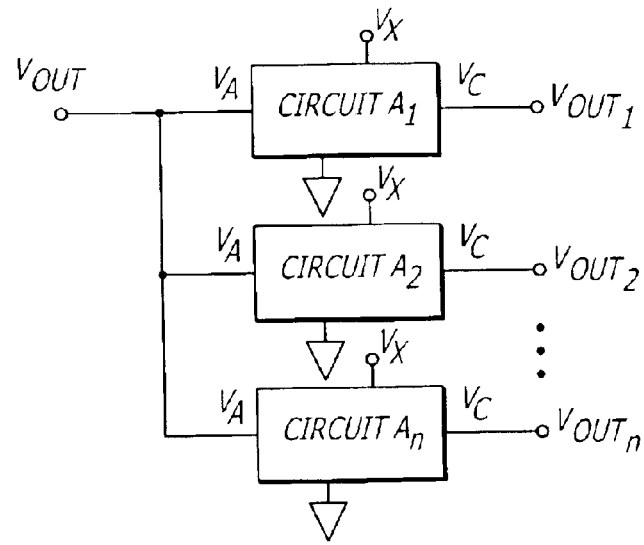
FIG. 11 illustrates the use of the embodiment of FIGS. 7 and 10 in single positive power supply, multiple load systems.
Figure 12:
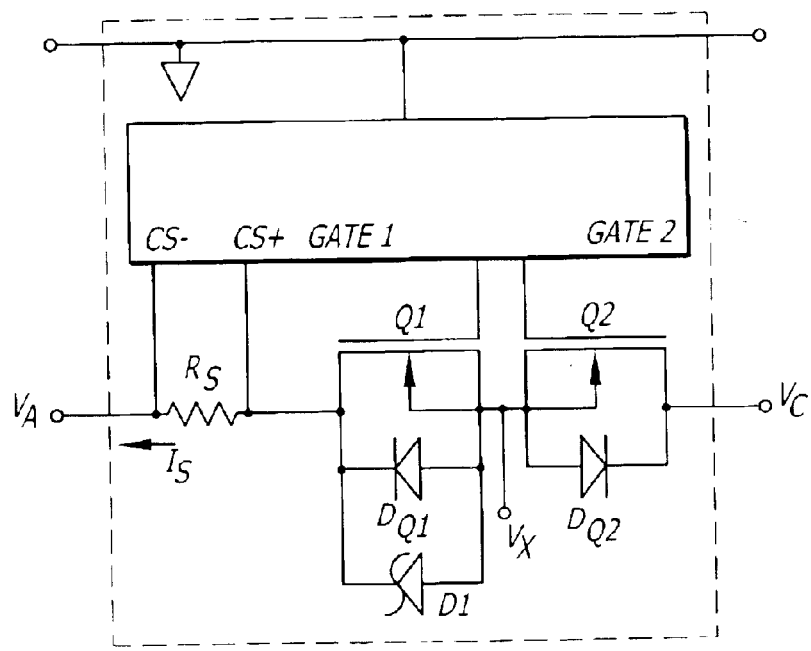
FIG. 12 illustrates an n-channel MOSFET embodiment of the present invention for use in redundant negative power supply systems such as illustrated in FIG. 15, or alternatively, in single negative power supply, multiple load systems as illustrated in FIG. 16.
Figure 13:
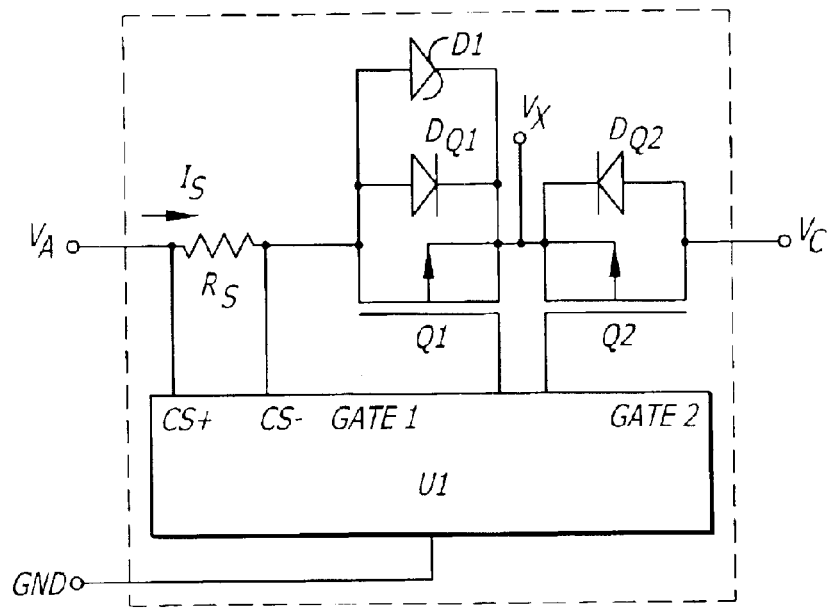
FIG. 13 illustrates a p-channel MOSFET embodiment of the present invention for use in redundant positive power supply systems such as illustrated in FIG. 8, or alternatively, in single positive power supply, multiple load systems as illustrated in FIG. 11.
Figure 14:
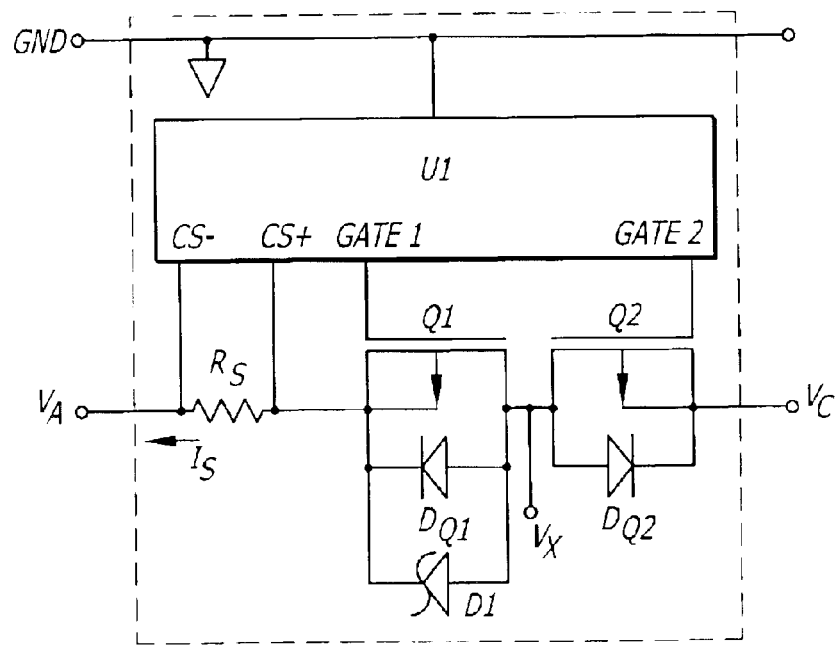
FIG. 14 illustrates a p-channel MOSFET embodiment of the present invention for use in redundant negative power supply systems such as illustrated in FIG. 15, or alternatively, in single positive power supply, multiple load systems as illustrated in FIG. 16.
Figure 15:
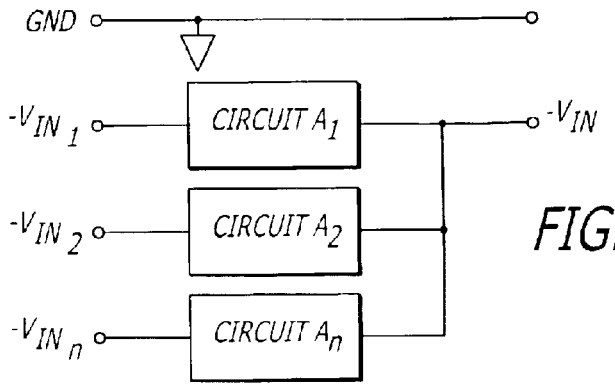
FIG. 15 illustrates an exemplary redundant negative power supply system using certain embodiments of the present invention.
Figure 16:
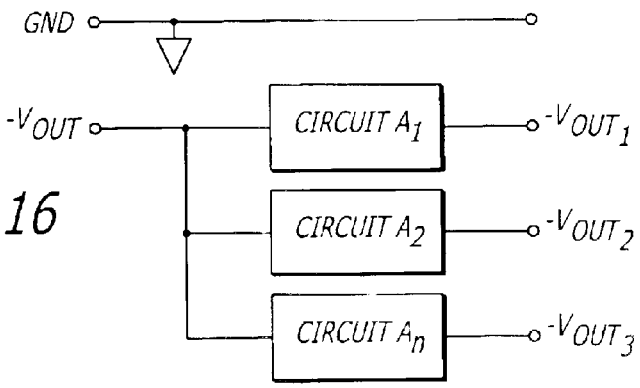
FIG. 16 illustrates an exemplary single negative power supply, multiple load system using certain embodiments of the present invention.

The exemplary circuits of FIGS. 7 and 10 may be used in redundant positive power supply systems such as illustrated in FIG. 8, or alternatively, in single positive power supply, multiple load systems as illustrated in FIG. 11. N-channel MOSFET embodiments of the present invention, such as shown in FIG. 12, may also be used in redundant negative power supply systems such as illustrated in FIG. 15, or alternatively, in single negative power supply, multiple load systems as illustrated in FIG. 16. P-channel MOSFET embodiments of the present invention, such as shown in FIG. 13, may also be used redundant positive power supply systems such as illustrated in FIG. 8, or alternatively, in single positive power supply, multiple load systems as illustrated in FIG. 11. Finally, p-channel MOSFET embodiments of the present invention, such as shown in FIG. 14, may also be used redundant negative power supply systems such as illustrated in FIG. 15, or alternatively, in single negative power supply, multiple load systems as illustrated in FIG. 16.

Figure 19:
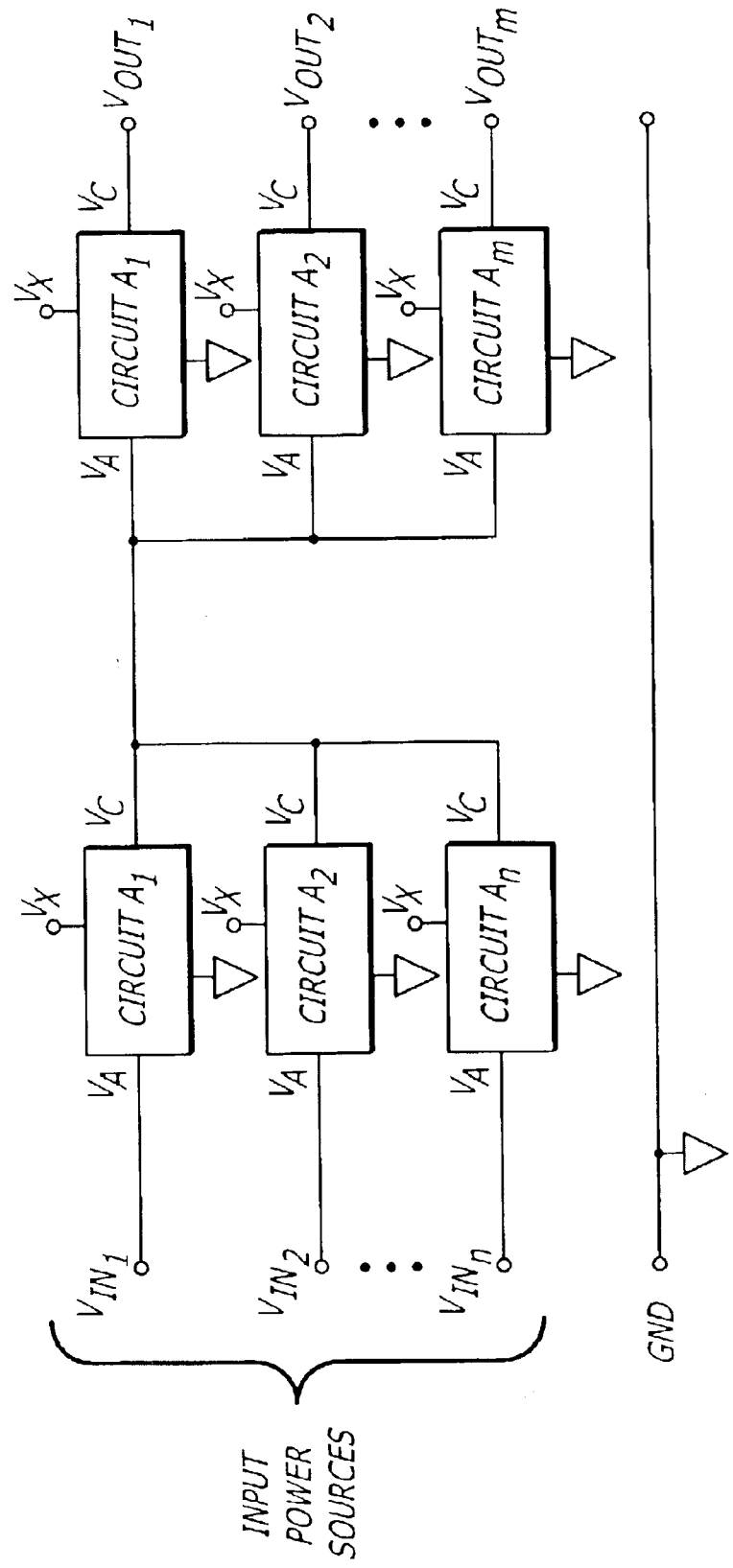
FIG. 19 is a diagram illustrating the use of the present invention in multiple power supply, multiple load systems.

The present invention may also be used in multiple power supply, multiple load systems, as illustrated in FIG. 19. As may be seen therein, the multiple supplies $VIN_1$ through $VIN_n$ are coupled through circuits $A_1$ through $A_n$ at the left of the diagram to a common output $V_C$. The output $V_C$ provides the load for the power supplies, as well as the power supply $V_A$ for the multiple circuits $A_1$ through $A_m$ coupled to multiple loads $VOUT_1$ to $VOUT_m$.

In the embodiments disclosed herein, starting to turn off Q1 as soon as possible after the current in the circuit falls below a threshold level greater than zero gains back the time lost in propagation delays in the circuit and the MOSFET Q1 gate discharging time, thereby turning off Q1 before the current through the MOSFET reaches zero, thus preventing reverse current flowing through node $V_C$ back to node $V_A$. The time it takes the current $I_S$ through the circuit to decrease from the threshold current level to zero is dependent on the voltage rise rate from any other power input applied to node $V_C$. The larger that voltage rise rate, the less time there will be for circuit delays and discharging of the gate of MOSFET Q1. Thus, if that rate of voltage rise is too quick, the present invention may reduce the reverse current over that of the prior art, but may not totally eliminate reverse current. However, if an embodiment of the present invention with the hot swap capability (FIGS. 10, 12, 13 or 14) is used with the same or similar circuits on other power supplies or on other loads, then the rate of rise of the voltage $V_C$ will automatically be limited by the operation of the hot swap feature, assuring the reverse currents will not occur. Thus, the circuits for the present invention have virtually zero recovery time when used in conjunction with other similar circuits, or different circuits having somewhat similar characteristics.

Figure 17:
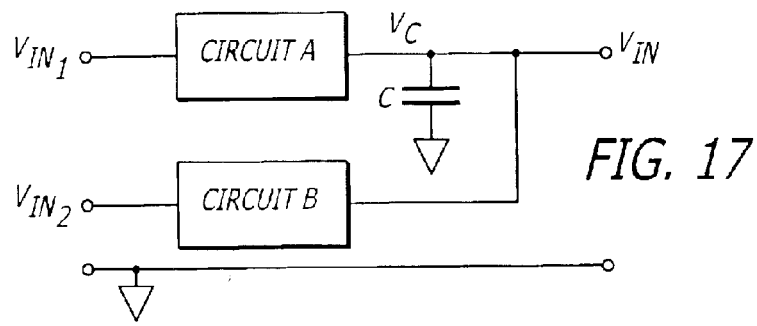
FIG. 17 is a diagram illustrating the coupling of a capacitor to the terminal VIN to slow the voltage rise on that terminal.
Figure 18:
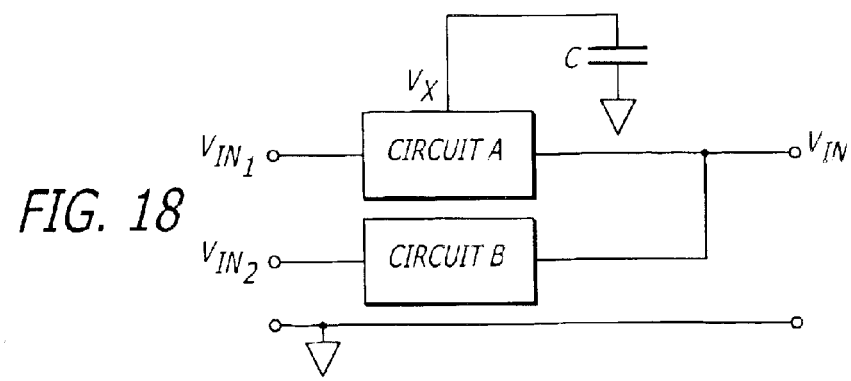
FIG. 18 is a diagram illustrating the coupling of a capacitor to the $V_X$ terminal to slow the voltage rise on both terminals VIN and VIN1.

In a possible operating condition where a current level through a circuit in accordance with the present invention is below the threshold level, MOSFET Q1 will be off. Consequently, a current that is below the threshold current will flow through MOSFET Q1's body diode. Since a body diode has slow recovery time, a Schottky diode D1 (FIGS. 7, 10, 12, 13 and 14) can be used to bypass the body diode. The Schottky diode is optional, though with the Schottky diode D1, the circuit will exhibit the fast recovery time of a Schottky diode in light load operation. For output power ORing applications wherein multiple power sources are powering a load, but not all such power sources are using a circuit in accordance with the present invention, a capacitor may be added at terminal $V_X$ or terminal $V_C$ to reduce the possible rate of rise of the voltage $V_C$ when the node $V_C$ is powered by another power source that is current limited. By way of example, FIG. 17 illustrates the use of capacitor C coupled to the output terminal VIN wherein circuit A is in accordance with the present invention (FIGS. 7, 10, 12, 13 and 14) and circuit B is not. FIG. 18 illustrates the use of capacitor C coupled to the $V_X$ terminal wherein circuit A is in accordance with the present invention (FIGS. 10, 12, 13 and 14) and circuit B is not. This latter configuration will slow the rise rate of both VIN and VIN1 terminals.

As stated before, frequently the sense resistor and the MOSFET or MOSFETs will be discrete components, with the rest of the circuit being in integrated circuit form, though this is not a limitation of the invention. Provision may be made for use of external components for setting circuit parameters, such as, by way of example, the threshold current and/or the voltage rise rate for hot swap purposes, or these such parameters may be set at the time of integrated circuit fabrication. Also, while the specific embodiments disclosed herein use a sense resistor, other current sensing techniques and devices could be used if desired.

Figure 20:
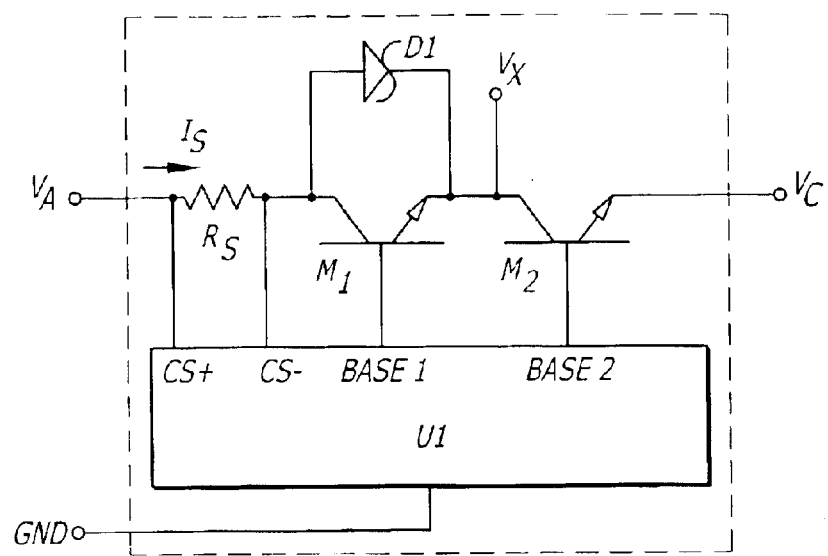
FIG. 20 presents an embodiment of the present invention similar to that of FIG. 10, though using bipolar transistors.

Other transistors may also be used, such as bipolar transistors and insulated gate bipolar transistors. By way of example, FIG. 20 presents an embodiment of the present invention similar to that of FIG. 10, though using bipolar transistors. While npn transistors M1 and M2 are shown, pnp transistors may also be used, provided the control is configured to properly define the base voltages for the off, turning on and on conditions of the transistors. However, in the case of bipolar and insulated gate bipolar transistors, a separate diode D1 will be used, integrated or discrete, which may be a silicon diode or more preferably a Schottky diode.

Figure 21:
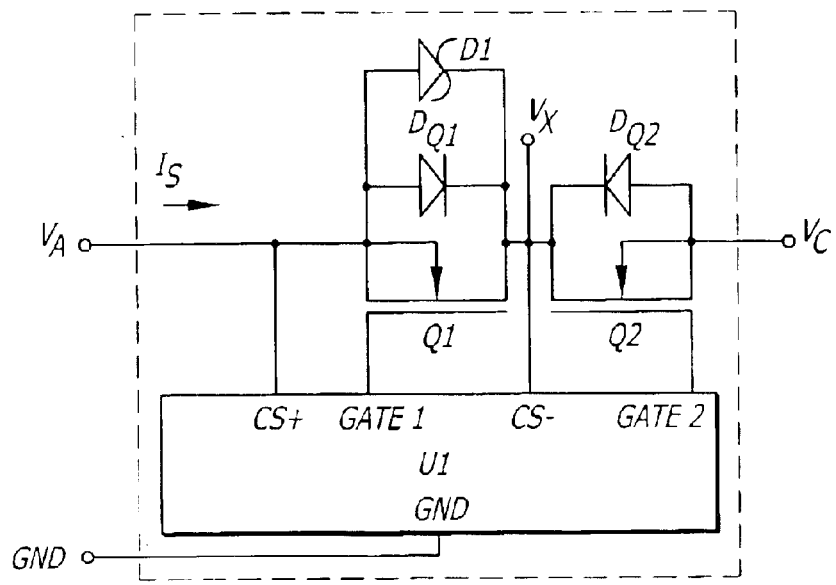

In the embodiments specifically shown and described herein, the transistors in each embodiment are of the same conductivity type, though this is not a limitation of the invention, as two transistors of different conductivity types could be used, or even transistors of different types could be used if desired. Also the series connection of the sense resistor to a power supply terminal, then Q1 (M1), then Q2 (M2). However the series connection of the two transistors and the current sense device may be in any order, provided the control is configured accordingly. The current sense device itself may include a bipolar or MOSFET current mirror mirroring a small part of the load current to a current sense circuit, a sense FET providing a current for sensing that is a fraction of the load current, or the current may be sensed by sensing the voltage across transistor Q1 or M1 without use of a separate sense device, as shown on FIG. 21.

Accordingly, the foregoing description is intended to be illustrative only and not by way of limitation of the invention, as numerous further alternative embodiments in accordance with the invention will be apparent to those skilled in the art. Thus while certain preferred embodiments of the present invention have been disclosed herein, it will be obvious to those skilled in the art that various changes in form and detail may be made in the invention without departing from the spirit and scope of the invention as set out in the full scope of the following claims.

What is claimed is:

1. A method of allowing current flow in a forward direction and reducing or preventing current flow in a reverse direction in multiple power supply, single load system, in a single power supply, multiple load system, or in a multiple power supply, multiple load system, comprising:

providing a first transistor and a diode;

coupling a first power supply, to a first terminal of the first transistor and coupling a second terminal of the first transistor to the load, and coupling a body to one of the first and second terminals of the first transistor so that one of the pn junctions acts as a body diode that will be biased toward conduction when the voltage on the first terminal of the first transistor exceeds the voltage on the second terminal of the first transistor;

coupling the first transistor and the diode in parallel between a source of power and a load so that the diode will be biased toward conduction when biased in the forward direction;

sensing the current through the parallel combination of the first transistor and the diode;

controlling the first transistor to turn the first transistor on when the current through the parallel combination in the forward direction is above a first threshold; and, controlling the first transistor to turn the first transistor off when the current through the parallel combination in the forward direction is below a second threshold, the first threshold being greater than the second threshold.

2. The method of claim 1 wherein the diode is a Schottky diode.

3. The method of claim 1 wherein the first transistor is an n-channel MOSFET.

4. The method of claim 3 wherein the diode is a body diode of the n-channel transistor.

5. The method of claim 3 wherein the diode is a Schottky diode.

6. The method of claim 1 wherein the first transistor is a p-channel MOSFET.

7. The method of claim 6 wherein the diode is a body diode of the p-channel transistor.

8. The method of claim 6 wherein the diode is a Schottky diode.

9. The method of claim 1 wherein the power supply is a positive power supply.

10. The method of claim 1 wherein the power supply is a negative power supply.

11. The method of claim 1 for ORing a plurality of power supplies with a single load.

12. The method of claim 11 wherein the method is practiced for each of the plurality power supplies.

13. The method of claim 1 for ORing a plurality of loads to a single power supply.

14. The method of claim 13 wherein the method is practiced for each of the loads.

15. The method of claim 1 for ORing a plurality of power supplies to a plurality of loads.

16. The method of claim 15 wherein the method is practiced for each of the power supplies and each of the loads.

17. The method of claim 1 wherein the current through the first transistor is sensed by sensing the voltage across a sense resistor in series with the first transistor.

18. The method of claim 1 wherein the second threshold is selected to allow the first transistor to be turned off before the current through the first transistor would have otherwise decayed to zero.

19. A method of allowing current flow in a forward direction and reducing or preventing current flow in a reverse direction in multiple power supply, single load system, in a single power supply, multiple load system, or in a multiple power supply, multiple load system, comprising:

providing first and second transistors and a diode;

coupling a first power supply to a first terminal of the first transistor and coupling a second terminal of the first transistor to the load, and coupling a body to one of the first and second terminals of the first transistor so that one of the pn junctions acts as a body diode that will be biased toward conduction when the voltage on the first terminal of the first transistor exceeds the voltage on the second terminal of the first MOSFET;

coupling the first transistor and the diode in parallel between a source of power and a load so that the diode will be biased toward conduction when biased in the forward direction;

coupling the second transistor in series with the first transistor between the power supply and the load;

sensing the current through the parallel combination of the first transistor and the diode;

controlling the first transistor to turn the first transistor on when the current through the parallel combination in the forward direction is above a first threshold;

controlling the first transistor to turn the first transistor off when the current through the parallel combination in the forward direction is below a second threshold; and, controlling the second transistor to turn the second transistor on at a controlled rate when a power supply voltage is first sensed.

20. The method of claim 19 wherein the second transistor is controlled to turn the second transistor on at a controlled rate when a power supply voltage is first sensed by changing the voltage of a control terminal of the second transistor at a substantially constant time rate of change.

21. The method of claim 19 wherein the second transistor is controlled to limit a time rate of change of the voltage on the load.

22. The method of claim 19 wherein the second transistor is controlled to limit the sensed current to a safe level after the sensed current has been found to exceed a predetermined limit.

23. The method of claim 19 further comprised of turning the second transistor off if the sensed current exceeds a predetermined limit.

24. The method of claim 23 further comprised of periodically controlling the second transistor to turn the second transistor on at a controlled rate after the second transistor has been turned off because the sensed current exceeded the predetermined limit.

25. The method of claim 19 further comprised of coupling a capacitor to the series combination of the first and second transistors to reduce the rate of rise of a node's voltage to which the capacitor is coupled.

26. The method of claim 19 wherein the first and second transistors are bipolar transistors.

27. The method of claim 19 wherein the first and second MOSFETs are insulated gate bipolar transistors.

28. The method of claim 19 wherein the first and second transistors are MOSFETs.

29. The method of claim 28 wherein the body diode of the second MOSFET is non-conducting when biased in the forward direction.

30. A method of allowing current flow in a forward direction and reducing or preventing current flow in a reverse direction in a multiple power supply, single load system, in a single power supply, multiple load system, or in a multiple power supply, multiple load system, comprising:

providing a first transistor and a diode;

coupling the first transistor and the diode in parallel between a source of power and a load so that the diode will be biased toward conduction when biased in the forward direction;

sensing the current through the parallel combination of the first transistor and the diode;

controlling the first transistor to turn the first transistor on when the current through the parallel combination is above a first threshold; and, controlling the first transistor to turn the first transistor off when the current through the parallel combination is below a second threshold, the second threshold being chosen to allow the full turn-off of the first transistor before the current in the forward direction otherwise would have decayed to zero, the first threshold being greater than the second threshold.

31. A method of allowing current flow in a forward direction and reducing or preventing current flow in a reverse direction in a multiple power supply, single load system, in a single power supply, multiple load system, or in a multiple power supply, multiple load system, comprising:

providing first and second transistors and a diode;

coupling the first transistor and the diode in parallel between a source of power and a load so that the diode will be biased toward conduction when biased in the forward direction;

coupling the second transistor in series with the first transistor between the power supply and the load;

sensing the current through the parallel combination of the first transistor and the diode;

controlling the first transistor to turn the first transistor on when the current through the parallel combination is above a first threshold; and, controlling the first transistor to turn the first transistor off when the current through the parallel combination is below a second threshold, the second threshold being chosen to allow the full turn-off of the first transistor before the current in the forward direction otherwise would have decayed to zero; and, controlling the second transistor to turn the second transistor on at a controlled rate when a power supply voltage is first sensed.

32. The method of claim 31 wherein the first transistor is a bipolar transistor.

33. The method of claim 31 wherein the first transistor is an insulated gate bipolar transistor.

34. The method of claim 33 wherein the diode is a Schottky diode.

35. The method of claim 31 wherein the first threshold is greater than the second threshold.

36. The method of claim 31 wherein the second transistor is turned on at a time rate of change when a power supply voltage is first sensed to limit the time rate of change in the sensed circuit.

37. The method of claim 31 wherein the second transistor is controlled to limit the sensed current to a safe level after the sensed current has been found to exceed a predetermined limit.

38. The method of claim 31 further comprised of turning the second transistor off if the sensed current exceeds a predetermined limit.

39. The method of claim 38 further comprised of periodically turning the second transistor on at a controlled rate after the second transistor has been turned off because the sensed current exceeded the predetermined limit.

* * * * *